United States Patent [19]
Brezina et al.

[11] Patent Number: 5,808,236
[45] Date of Patent: Sep. 15, 1998

[54] HIGH DENSITY HEATSINK ATTACHMENT

[75] Inventors: Johnny Roy Brezina; John Saunders Corbin, Jr., both of Austin; Howard Victor Mahaney, Jr., Cedar Park; James Robert Taylor, Leander, all of Tex.

[73] Assignee: International Business Machines Corporation, Armonk, N.Y.

[21] Appl. No.: 827,745

[22] Filed: Apr. 10, 1997

[51] Int. Cl.$^6$ .................................................. H01L 23/26
[52] U.S. Cl. ...................... 174/16.3; 165/80.3; 361/716; 361/704; 257/719; 257/707
[58] Field of Search .................................. 257/718, 719, 257/707; 174/52.4, 16.3; 361/688, 702, 709, 710, 719, 715, 716, 720, 704; 165/80.3

[56] References Cited

U.S. PATENT DOCUMENTS

| | | | |
|---|---|---|---|
| 5,243,218 | 9/1993 | Zenitani et al. | 257/712 |
| 5,285,108 | 2/1994 | Hastings et al. | 257/712 |
| 5,307,239 | 4/1994 | McCarty et al. | 361/704 |
| 5,386,338 | 1/1995 | Jordan et al. | 361/704 |
| 5,424,918 | 6/1995 | Felps et al. | 361/704 |
| 5,525,835 | 6/1996 | Nishiguchi | 257/712 |
| 5,542,468 | 8/1996 | Lin | 165/80.3 |
| 5,586,005 | 12/1996 | Cipolla et al. | 361/719 |

OTHER PUBLICATIONS

*IBM™ Technical Disclosure Bulletin,* "Low Profile Heat Sink," vol. 28, No. 12, May, 1986.

*IBM198 Technical Disclosure Bulletin,* "Heat Sink Attachment for Improved Electro–Magnetic Compatibility and Shock Performance," vol. 38, No. 03, pp. 383–385, Mar., 1995.

"Spring–Loaded Heat Sinks for VLSI Packages," *Research Disclosure,* Oct. 1990, No. 318, Kenneth Mason Publications Ltd., England.

"Heatsink Attachment for Improved Electro–Magnetic Compatibility and Shock Perfomance," *IBM Technical Disclosure Bulletin,* vol. 38, No. 03, Mar. 1995, by J.S. Corbin et al., pp. 383–386.

*Primary Examiner*—Bot L. Ledynh
*Assistant Examiner*—Hung V. Ngo
*Attorney, Agent, or Firm*—Winstead Sechrest & Minick P.C.; Elizabeth A. Apperley; Volel Emile

[57] ABSTRACT

An apparatus and method therefore mount an array of different heatsinks to a closely packed array of data processing elements utilized within a data processing system. The apparatus includes a metal frame with multiple apertures in the bottom to allow access to the tops of the devices for which heatsinks will be provided. The metal frame has multiple apertures that allow access to the tops of the data processing elements underneath. The metal frame serves as a containment vehicle for multiple heatsinks, and also provides rigidity to the printed circuit board in the particularly vulnerable vicinity of the corners where the devices are attached to the printed circuit board.

9 Claims, 5 Drawing Sheets

HIGH DENSITY HEATSINK ATTACHMENT

TECHNICAL FIELD

The present invention relates in general to attachments for heatsinks in data processing systems, and in particular, to high density heatsink attachments in data processing systems.

BACKGROUND INFORMATION

As the power levels of microprocessors and other data processors continue to increase to provide higher levels of performance, the task of cooling these microprocessors as they operate in data processing applications becomes more of a challenge. When microprocessors are manufactured to provide higher levels of performance the microprocessors typically increase in size. Furthermore, with increasing sizes, more massive heatsinks are required to cool the larger microprocessors. Additionally, when constraints due to available air flow are accounted for, the heatsink required to cool the microprocessor typically has a larger "footprint" than the microprocessor it is cooling. Thus, in many data processing systems, a designer of the data processing system must ensure both that an adequate amount of space is available to implement a heatsink and that the heatsink is large enough to cool an associated microprocessor.

There are a number of requirements to be considered in designing a heatsink attachment to a microprocessor in a data processing system. It should be noted that the microprocessor is typically attached to a module or printed circuit board card. Thus, in designing a heatsink attachment to the printed circuit board card, the requirements include providing an attachment which allows for a good thermal path between the heatsink base and the top of the microprocessor. Typically, such an attachment may be accomplished either by attaching the heatsink directly to the module cap with screws or adhesives, or by compliantly loading the heatsink against the top of the microprocessor. As high power microprocessors require larger heatsinks, surface-mount attachment designs are difficult to implement as the microprocessors are quite fragile and may cause stress on the microprocessor when directly attached thereto. Stated another way, surface mount attachment designs fail to provide adequate shock and vibration resistance to ensure that the microprocessor will not be damaged during handling. Therefore, in applications in which a preferred method for addressing the problems is a surface-mount attachment design, the heatsink may be directly attached to the printed circuit board to relieve the strain on the microprocessor. However, the direct attachment method for attaching a heatsink directly to a printed circuit board is complicated by the fact that solder column (CGA), solder ball (BGA), and other surface mount attachment devices typically have a poor tolerance control on the height of the processing element above the surface of the printed circuit board. When the height of the processing element above the card surface is not exact and the heatsink does not intimately contact that microprocessor surface, the microprocessor will not be adequately cooled. To compensate for these deficiencies, some manufacturers have modified the heatsink to comprise a variable-length mounting post in specified locations thereon. The post is firmly attached to the heatsink using threaded fasteners or any other structurally sound attachment method, such as retaining rings, press fits, or the like. This attachment will prevent removal of the post without damaging the heatsink. Similarly, a well is attached to the circuit card using screws, nuts, clips, or the like. The attachment of the well, the posts, and the posts to the well must be capable of withstanding the expected shock, vibration, and handling loads without shifting the heatsink. When the heatsink is to be attached, the heatsink is placed over the microprocessor so that the posts enter the well. In this position, the heatsink rests directly on the microprocessor, rather than on the post. Sufficient force is then applied to the heatsink to establish intimate thermal contact between the heatsink and the microprocessor, and the circuit card is supported from below within the vicinity of the wells.

Furthermore, in an article entitled "Heatsink Attachment for Improved Electro-Magnetic Compatibility and Shock Performance," published in the IBM™ *Technical Disclosure Bulletin*, Volume 38, No. 03, pp. 383–385, in March 1995, an improved heatsink attachment is disclosed. In this disclosure, a frame assembly is used to hold a heatsink to a top of a data processor using a heatsink/clip assembly. After the data processor is attached to the printed circuit board, the frame assembly is installed by snapping it into the printed circuit board through four holes that are drilled in the vicinity of the corners of the data processor. These holes are located in pads which are electrically connected to the ground planes in the printed circuit board. The frame assembly includes a stamped and formed metal frame with a central hole which allows protrusion of a single data processor through the frame. Four snap-top standoffs may then be used to allow the frame assembly to snap into the four holes drilled into the printed circuit board. The snap-top standoffs are not required, and it should be noted that any mechanical means of attaching the frame is acceptable.

When this frame assembly is utilized, the heatsink is installed by first applying a thermal interface material to the heatsink and/or data processor, and then nesting the heatsink inside the frame assembly and on top of the data processor. A spring clip latches onto the frame assembly which concurrently springloads the heatsink onto the data processor, providing a good thermal interface. Furthermore, since the heatsink is compliantly mounted to the module, the module height tolerances can be accommodated.

While the aforementioned frame assembly provides a good solution for problems associated with mounting single data processors onto printed circuit boards, many current data processing systems are multi-processing or symmetric multi-processing (SMP) machines. Within these types of machines, the duplicity of high power processors and proximity of cache controllers implemented in such machines on a single printed circuit board can make the installation of heatsinks difficult. For performance reason, the set of high power processors and cache controllers must typically be positioned in a very compact arrangement. Additionally, the power characteristics of these devices often dictate the use of large heatsinks, wherein the heatsinks have base dimensions that are larger than the outline of the devices. Such additional difficulties make heatsink installation and retention even more of a challenge.

The methodologies for attaching and installing heatsinks described above fail to provide an adequate solution for installing heatsinks in multi-processor type machines. For example, if a heatsink was attached directly to the data processor or cache controller via an adhesive, the data processor or cache controller would have to absorb all dynamic loads resulting from the handling of the printed circuit board. Furthermore, replacement of either the data processor or cache controller would be very difficult given the attachment of such large heatsinks directly to their surfaces. Additionally, the frame assembly methodology described above provides only for a single processor. While multiple frames might be implemented, the steps required to implement multiple frames during the manufacturing process may often be prohibitive as they would unduly increase the overhead associated with manufacturing and completing printed circuit boards for the data processing systems. Additionally, multiple frames may require additional holes which would adversely affect wireability.

Additionally, the framing assembly described above contemplates a standard height for a data processor which it will be mounted around. Because SMP machines with multiple processors and cache controllers comprise devices which have varying heights and compact arrangements, the frame assembly described above would be difficult to implement as it would not conform with space requirements or provide the proper contact between a heatsink and the data processor.

Therefore, a need exists for an apparatus for attaching a heatsink to the processors and controllers on a printed circuit board of an multi-processing machine. In addition to a heatsink attachment which compensates for the compact arrangement typical of such multi-processing machines, a need exists for a heatsink attachment which allows for the use of large heatsinks whose base dimensions are larger than the outline of the processors for which heat is dissipated. Furthermore, a number of other requirements should be considered in developing an attachment of heatsinks to a compact array of substantially different devices found within multi-processing machines. For example, to attain a high degree of packing density, a need exists for heatsink attachment which allows a minimum space between heatsink and a minimum space for heatsink retention hardware. Additionally, there exists a need for a heatsink attachment which provides a good thermal path between the heatsink and the device. As well, the attachment methodology should allow for the easy removal of the heatsink to provide access for rework or repair to devices around the perimeter of the microprocessor or cache controller. A need also exists for a heatsink which provides a good ground connection between the heatsink and the ground plane of the printed circuit board for better EMC (Electro Magnetic Compatability) containment. Furthermore, a need exists for an attachment which carefully controls the static loading of the heatsink against the processing elements of the multi-processing machine so as not to damage the device or connections between the device and the printed circuit board. A need also exists for a heatsink attachment which utilizes as many common parts as available and minimizes the number of holes required in a printed circuit board for installation for improved printed circuit board wireability. Additionally, a need exists for a heatsink assembly which is able to withstand the anticipated shock and vibration of the environment in which the multi-processing machines are implemented.

SUMMARY OF THE INVENTION

The previously mentioned needs are fulfilled with the present invention. Accordingly, there is provided, in a first form, an apparatus for attaching a first heatsink to a printed circuit board having a plurality of processing elements mounted thereon. The apparatus includes a plurality of apertures. Each of the plurality of apertures corresponds to one of the plurality of processing elements of the printed circuit board. The apparatus also includes a first attachment means for attaching the first heatsink over at least a first one of the plurality of apertures.

Additionally, there is provided, in a second form, a printed circuit board. The printed circuit board includes a first data processing element and a second data processing element. A frame is connected to the printed circuit board. The frame includes a first aperture positioned over the first data processing element and a second aperture positioned over the second data processing element.

These and other features, and advantages, will be more clearly understood from the following detailed description taken in conjunction with the accompanying drawings. It is important to note the drawings are not intended to represent the only form of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
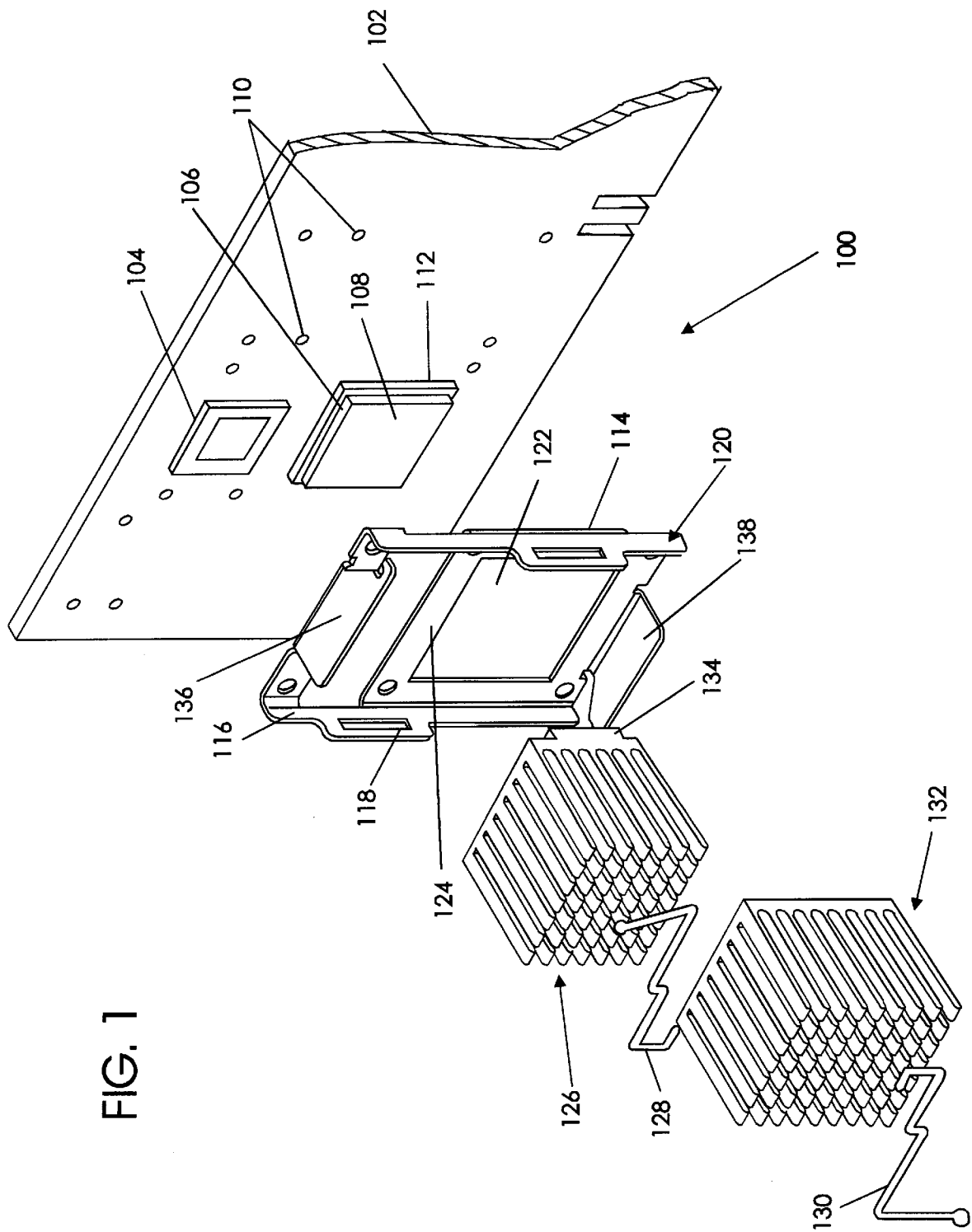
FIG. 1 illustrates, in an exploded assembly diagram form, a high-density heatsink attachment of the present invention.

The present invention provides an apparatus and method for mounting an array of different heatsinks to a closely packed array of processors, cache controller devices, and any other type of data processing element utilized within a data processing system. The heatsink apparatus of the present invention includes a single metal frame with multiple apertures in the bottom to allow access to the tops of the devices for which heatsinks will be provided. Thus, in one embodiment of the present invention, a single metal frame has multiple apertures that allow access to the tops of the data processing elements underneath.

In addition to the apertures, the frame of the present invention includes several metal standoffs which allow rigid attachment of the frame to a printed circuit board using screws. Additionally, it should be noted that other methods for attaching the frame to the printed circuit board may be used. Such other attachment means include "snap" connections, also referred to as PEM® studs, clips, or any other type of attachment.

The metal frame of the present invention serves as a containment vehicle for multiple heatsinks, and also provides rigidity to the printed circuit board in the particularly vulnerable vicinity of the corners where the devices are attached to the printed circuit board. Such increased rigidity improves the fragility characteristics of the assembly, as card bending near device corners may cause damage to the attachment connections, where solder balls (BGA) or solder columns (CGA) are used. Additionally, the sides of the frame assembly of the present invention not only provide a nest for the installed heatsinks, but also provide lateral containment of the heatsinks during shock and vibration events to substantially improve the overall ruggedness of the assembly.

It should be noted that in the present invention, a single frame can accommodate multiple nested heatsinks. For example, assume in one embodiment that a single frame can accommodate two nested heatsinks. While two individual frames could be used using prior art techniques, it would be required to drill four holes within the printed circuit board for each individual frame. By using a single frame of the present invention with nested heatsinks, fewer mounting holes are required within the printed circuit board. In a single frame which accommodates two nested heatsinks, six holes within a printed circuit board may be used to provide adequate stiffness when the frame is attached to the printed circuit board. It should be noted that the frame assembly of the present invention is grounded to the ground plane of the card via copper pads on the card. The copper pads are electrically connected to the ground plane within the printed circuit board and the frame standoffs contact these copper pads when the frame is installed. When the heatsinks are installed into the frame, the heatsinks conduct through the metal torsion clip bars used to hold the heatsinks in place, through the frame, and to the printed circuit board ground plane. This connection to the ground plane of the printed circuit board provides improved EMC performance.

While the foregoing discussion provides a general description of the methodology and apparatus of the present invention, a more detailed description of the apparatus and method will subsequently be described herein.

In the following description, numerous specific details are set forth to provide a thorough understanding of the present invention. However, it will be obvious to those skilled in the art that the present invention may be practiced without such specific details. In other instances, well-known elements have been generally shown in order not to obscure the present invention in unnecessary detail. Refer now to the drawings wherein depicted elements are not necessarily shown to scale and wherein like or similar elements are designated by the same reference numeral through the several views.

Refer now to FIG. 1, wherein printed circuit board 100 in accordance with one embodiment of the present invention is illustrated in an exploded view. Printed circuit board 100 comprises a processor card 102, a processor module 104, an exposed silicon chip 106, a cap 108, a plurality of frame mounting holes 110, a cache controller 112, a plurality of frame standoffs 114, a frame 116, a processor heatsink 126, a torsion clip 128, a torsion clip 130, and a cache heatsink 132. Processor heatsink 126 comprises a heatsink pedestal 134.

Frame 116 comprises a clip anchor slot 118, a clip anchor slot 120, a cache device access aperture 122, a processor device access aperture 124, a clip latch 136, and a clip latch 138.

It should be noted that silicon chip 106 is mounted upon processor module 104, and is therefore "uncapped." In contrast, cache controller 112 comprises a cap 108. It should be noted that uncapped devices, such as processor module 104, typically have a lower height than capped devices such as cache controller 112.

In FIG. 1, cache controller 112 and silicon chip 106, are surface-mount attached to processor card 102 using standard assembly practices. Such practices include ball grid arrays (also referred to as solder balls) and solder column connections, among others.

After attachment of processor module 104 and cache controller 112 to processor card 102, frame 116 is installed and attached to processor card 102 via a plurality of screws which pass through a corresponding one of the plurality of frame mounting holes 110, where they are then threaded into frame standoffs 114. Frame mounting holes 110 comprise copper pads which allow for the frame to be electrically connected to the ground plane of processor card 102 via the screws and frame standoffs 114. In one embodiment of the present invention, the screws, frame, and frame standoffs 114 are made from steel when the microprocessor is utilized within the data processing system. Additionally, frame 116 is plated to prevent corrosion and to provide a good ground path for the heatsinks which it will support. In alternative embodiments, frame 116, frame standoffs 114, and the screws may be made of any substance which is electrically conductive as these devices are used to ground a heatsink to a ground plane of processor card 102.

In an embodiment of the invention illustrated in FIG. 1, frame 116 comprises two apertures, processor device access aperture 124, and cache device access aperture 122. To support a frame having two apertures, the frame in one embodiment of the present invention has six frame standoffs 114 integrated thereon. The integration of six frame standoffs 114 allows for the rigid attachment of frame 116 to processor card 102 using screws, or some other means of attachment. Such other means of attachment may include snaps, or PEM® snap-top standoffs, where PEM is a trademark of Penn Engineering and Manufacturing Corporation. Furthermore, it should be noted that the copper pad to which the frame standoffs 114 are coupled is manufactured as a portion of processor card 102.

Frame 116 comprises a stamped and formed metal frame with a number of apertures required by data processors integrated on processor card 102. Thus, in the example described herein, frame 116 will have one aperture for silicon chip 106 and processor module 104 and one aperture for capped cache controller 112. These apertures allow for the protrusion of cache controller 112, or any other capped module, through frame 116. It should be noted that processor module 104 is not a capped device. Therefore, processor module 104 does not protrude through its respective opening within frame 116.

It should be noted that processor device access aperture 124 and cache device access aperture 122 allow two different heatsinks, to come into intimate contact with their corresponding high power devices. Each of the heatsinks is designed to provide a degree of cooling required by the individual device to which it is interfaced. As mentioned above, completely different device classes are accommodated in frame 116 and by the methodology of the present invention. For example, processor module 104 supports an exposed silicon chip 106, while cache controller 112 is a capped device. As a capped device, cache controller 112 actually protrudes through its aperture in frame 116 (124), while silicon chip 106 is well below its corresponding frame aperture.

To accommodate such substantial differences in height with a similar class of heatsinks, a unique pedestal was integrated into an extrusion for processor heatsinks 126. The pedestal is referred to as heatsink pedestal 134 in FIG. 1. Heatsink pedestal 134 allows the top surfaces of processor heatsink 126 base and cache heatsink 132 base to be co-planar, while being in intimate contact with the different device classes having different heights. When the upper surfaces of heatsinks 126 and 132 are the same height, a same or a similar device may be used to hold a corresponding heatsink in place. However, it should be well-known to those with skill in the art that the heatsinks are not limited to having coplanar bases. If the heatsink bases are not co-planar, a clip or other method for holding a heatsink in place will be different and unique for each heatsink.

Therefore, by ensuring that the presentation of the heatsink is similar, even when different modules are placed underneath, the same clips or means for holding the heatsink in place may be implemented to improve the manufacturability of the printed circuit board 100 of the present invention, and to reduce the number of unique parts required during assembly.

To install the heatsink, a thin film of thermally conductive paste or other similar interface material is typically installed between a heatsink and a corresponding device to facilitate the transfer of heat from the higher power device to the heatsink. In one embodiment of the present invention, a Thermoset™ 228 grease is utilized. However, it should be known that any other type of conductive paste, thermal oil, or a pad interface material, such as a Chomeric pad, may be utilized. Any of the interface materials utilized to provide this interface function should be able to accommodate slight surface irregularities between the bottom of the heatsink and either silicon chip 106 or cap 108 of cache controller 112.

Processor heatsink 126 is installed in processor device access aperture 124. Heatsink pedestal 134 of processor heatsink 126 extends through processor device access aperture 124 to come into contact with silicon chip 106. Additionally, cache heatsink 132 is placed within frame 116 in processor device access aperture 124. As previously described, cap 108 of cache controller 112 extends through process device access aperture 124. Once processor heatsink 126 and cache heatsink 132 are seated within frame 116, they are loaded onto a respective one of silicon chip 106 and cache controller 112 using a torsion clip, such as torsion clip 128 and torsion clip 138. To seat a heatsink in its respective position one end of the torsion bar is nested within a clip anchor slot (118 and 120) of frame 116, while another end of the torsion clip is rotated downward into the clip latch (136 and 138) of frame 116. More specifically, a first end of torsion clip 128 is inserted within clip anchor slot 118 and a second end of torsion clip 128 is rotated downward into clip latch 136. Similarly, a first end of torsion clip 130 is inserted within clip anchor slot 130 and a second end is rotated downward into clip latch 138.

Clip latch 136 is higher than clip latch 138 because processor heatsink 126 is smaller and, therefore, lighter than cache heatsink 132. Given the smaller mass of processor heatsink 136, clip latch 136 is higher to ensure that one amount of load imparted onto processor heatsink 126 due to the torque exerted by torsion clip 128 is substantially less than the torque exerted by a torsion clip 130 upon cache heatsink 132. An objective of this feature of the present invention is to match a preload force on each heatsink (126 and 132) with the mass of a corresponding heatsink so that intimate contact is maintained between the heatsink and a corresponding device during shock events, while at the same time, minimizing the total load exerted on each module. Furthermore, the same torsion clip is used in each heatsink installation, although the latch features are geometrically different to allow for different prescribed preloads for each device. The ability to use the same torsion clip for both heatsinks allows for ease of manufacturing.

Thus, because torsion clips 128 and 130 install into frame 116 within a single thickness of frame material, adjacent frames may be installed with very little clearance between them. This results in a very high density processor configuration on processor card 102, with minimal wasted volume. Additionally, to further improve processor routing, frames may be developed with additional device apertures.

Figure 2:
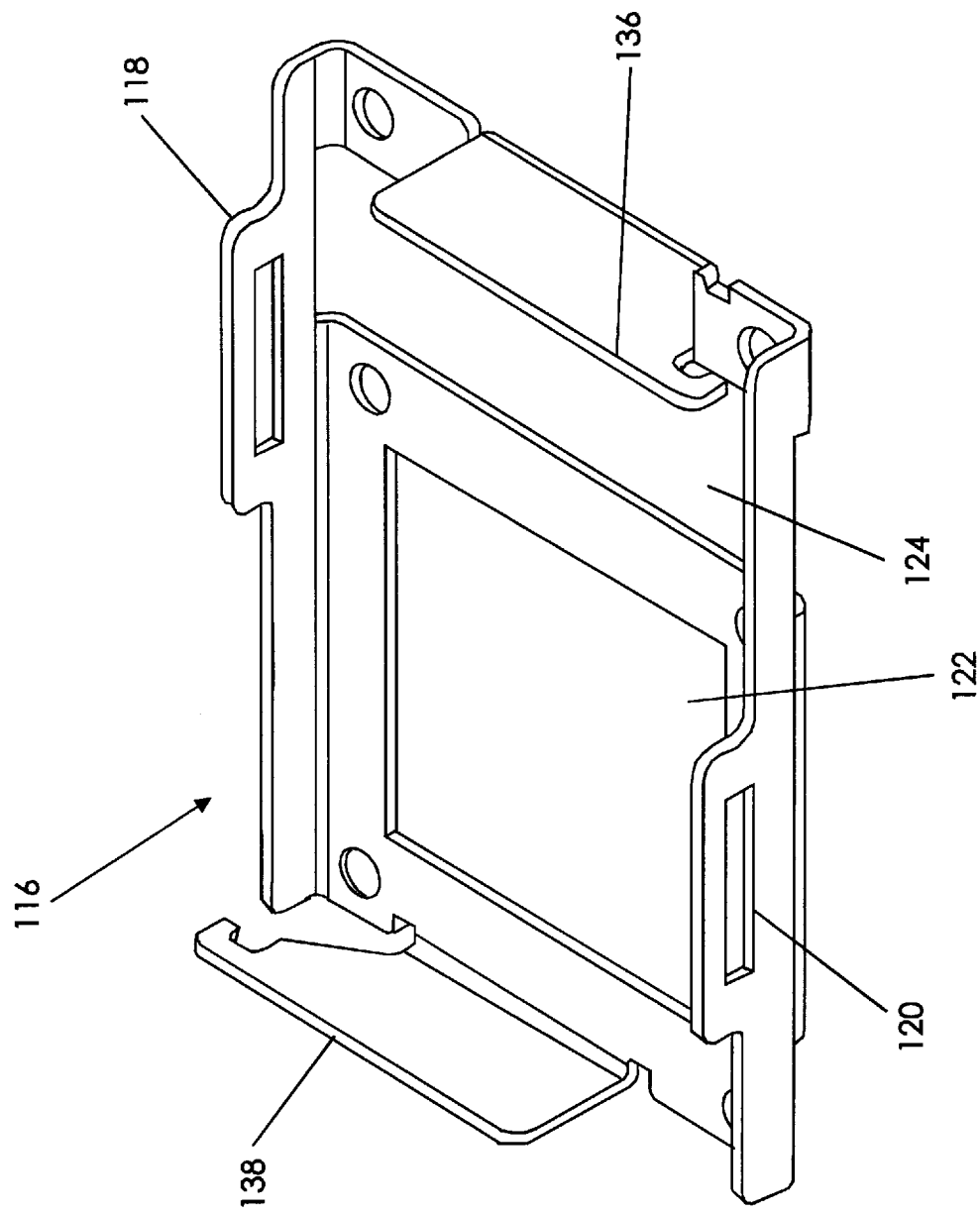
FIG. 2 illustrates, in an isometric view, a frame in accordance with one embodiment of the present invention.

FIG. 2 illustrates a sample frame 116 in greater detail. As may be observed therein, the apertures are two different sizes to accommodate the different sizes of the devices mounted to processor card 102. The use of a frame, such as frame 116, allows the multiple processors on multiprocessor data processing system, such as that illustrated in FIG. 1 to be minimally spaced, while still providing the required heat conduction using processor heatsink 126 and cache heatsink 132. It should be noted that the apertures within frame 116 may be assigned to accommodate any size or number of modules which are implemented on processor card 102. Therefore, should three modules (or sets of three modules) be implemented on processor card 102, frame 116 could be modified to add an additional aperture for the third device. In the alternative, frame 116 could be placed upon processor card 102 twice to provide heatsink attachments for one or two additional devices implemented thereon. It should be well understood to those with skill in the relevant art that fewer devices or more devices may be implemented on processor card 102 using either modified forms of frame 116 or multiples of frame 116.

Figure 3:
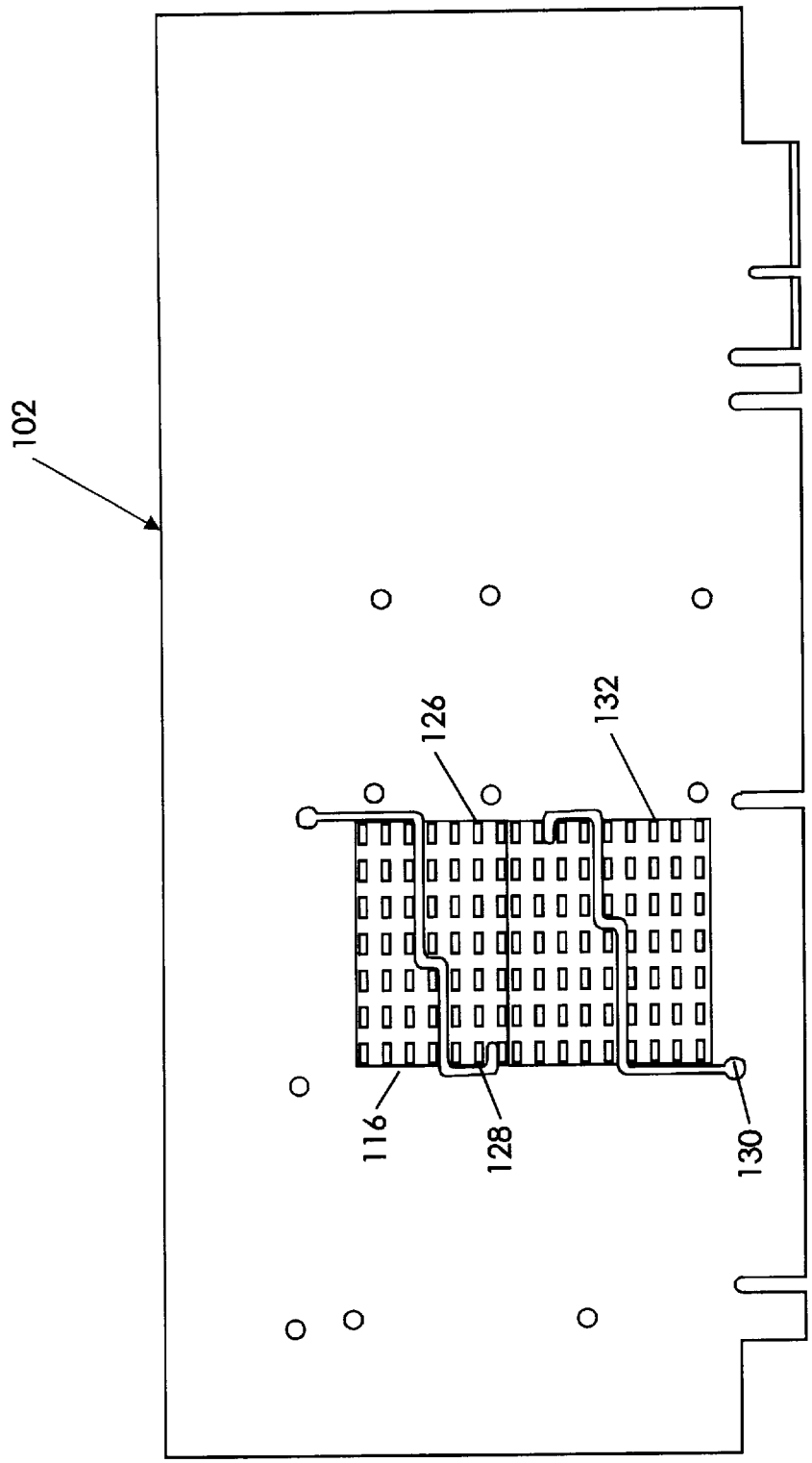
FIG. 3 illustrates, in a top view, a printed circuit board having a plurality of heatsinks attached using the high density heatsink attachment of the present invention.

FIG. 3 illustrates a top view of processor card 102 with processor heatsink 126 and cache heatsink 132 installed within frame 116 using torsion clips 128 and 130, respectively. FIG. 3 illustrates how closely processor heatsink 126 and cache heatsink 132 may be positioned. It should be noted that while processor heatsink 136 and cache heatsink 132 are substantially aligned, the heatsinks are not required to be aligned in all embodiments of the present invention.

Figure 4:
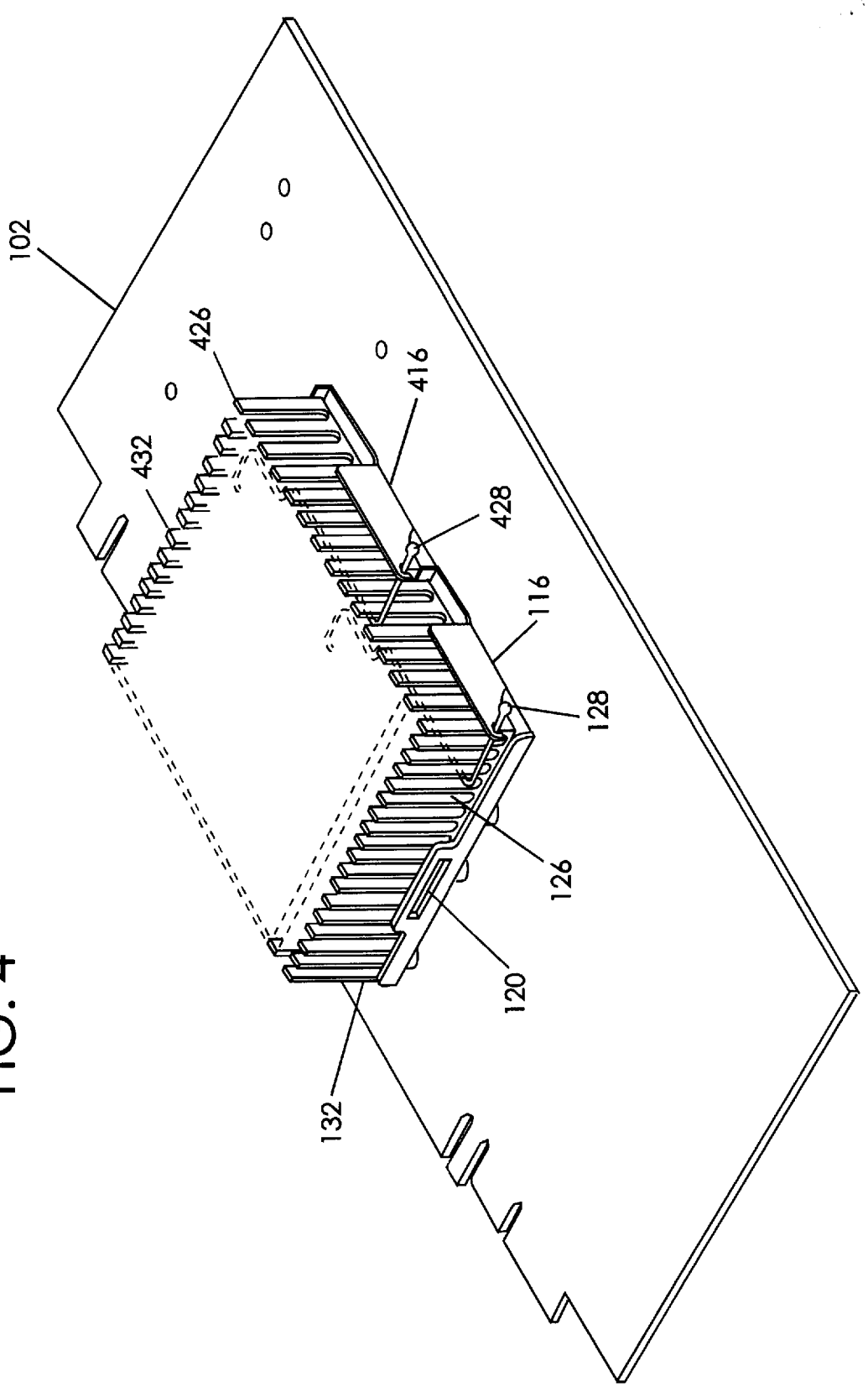
FIG. 4 illustrates, in an isometric view, the printed circuit board having the high density heatsink attachment in accordance with one embodiment of the present invention.

FIG. 4 illustrates processor card 102 having frame 116 and a second frame, 416, mounted thereon. Given the efficient usage of space, multiple frames, such as frame 116 and frame 416, may be mounted on processor card 102 efficiently, and compactly.

Figure 5:
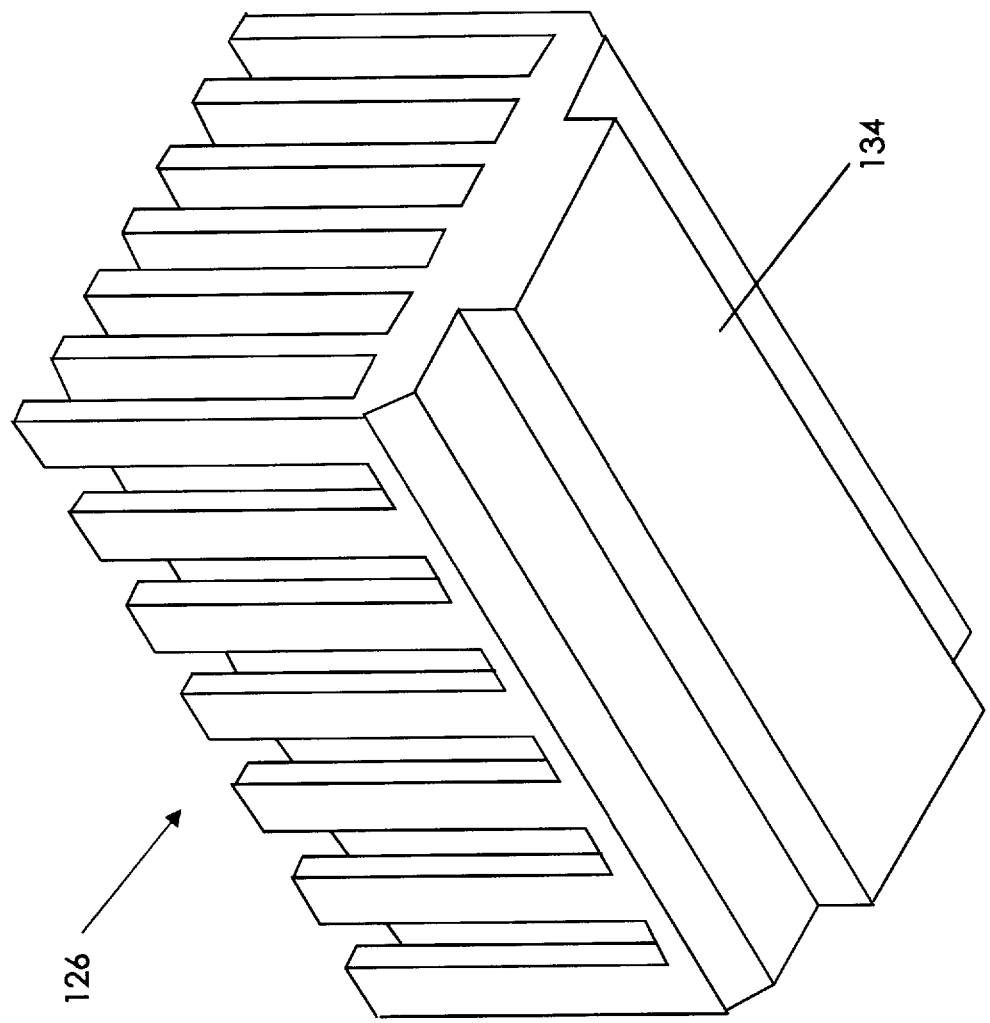
FIG. 5 illustrates, in an isometric view, a heatsink having a pedestal in accordance with one embodiment of the present invention.

FIG. 5 illustrates processor heatsink 126 in greater detail. As may be observed therein, processor heatsink 126 comprises heatsink pedestal 134. Heatsink pedestal 134 extends below frame 116 through processor device access aperture 124 to make contact with silicon chip 106. Any heatsink which is being provided to disperse heat associated with an uncapped device will have such a pedestal integrated therewith. The use of a pedestal, such as heatsink pedestal 134, uniquely compensates for height differentials between different classes of devices, such as capped devices and uncapped devices. As previously described, the ability to have heatsink which are flush across an entire processor card 102 aides in manufacturability of printed circuit board system 100.

Thus, through the use of FIGS. 1–5, it may be observed that the present invention discloses an apparatus and methodology for mounting an array of different heatsinks to a closely packed array of modules. In providing this methodology for mounting an array of different heatsinks, the present invention fulfills all the requirements of heatsink attachments. First, a high degree of packing density is attained through the use of a frame which allows heatsinks to be placed in contact with one another so that space on a card, such as processor card 102, may be used most efficiently.

Additionally, the heatsinks attachment must provide a good ground connection. In the present invention, torsion clips 128 and 130 are in contact with the frame via clip anchor slot 118 and clip anchor slot 120, respectively. Clip anchor slot 118 and clip anchor slot 120 are integral within frame 116 and, therefore, are connected to a ground path via copper pads of processor card 102 and frame standoffs 114 and frame 116. These connections form a good ground connection between the heatsinks and the ground plane of processor card 102 for better EMC containment.

Additionally, the heatsink attachment of the present invention provides a good thermal path through the use of torsion clips 128 and 130. Each of torsion clips 128 and 130 compliantly loads a respective one of processor heatsink 126 and cache heatsink 132 against a corresponding device mounted on processor card 102. Furthermore, the use of torsion clips 128 allows a corresponding heatsink to be easily removed to provide access for rework or repair to passive devices or other small devices around the perimeter of processor module 104 and cache controller 112. As well, because the heatsinks are nested within frame 116, lateral shock loads will be transmitted through the frame to processor card 102. By transmitting the lateral shock loads through frame 116 to processor card 102, silicon chip 106 and cache controller 112 are not required to absorb such shock loads. Therefore, damage to silicon chip 106 and cache controller 112 due to loads associated with movement and use of processor card 102 is reduced.

The foregoing discussion provides a description of one embodiment of the present invention which implements an apparatus and method for implementing a high density heatsink attachment. It should be noted that this is one embodiment of the present invention, and that additional configurations may be implemented. For example, frame 116 may comprise more apertures than those disclosed herein. Additionally, several multiples of frames, such as frame 116, may be implemented on a card, such as processor card 102. As well, it should be noted that the heatsinks may be "pinned," such as those illustrated in FIGS. 1–5. Or, the heatsinks may be "finned," or have any configuration required to perform a heatsink function. As well, the torsion bars used to hold the heatsinks into frame 116 are not symmetrical in the previously described embodiment of the invention. However, the torsion bars could be symmetrical if the bars had a different shape and if the pin pattern and relative size of the heatsink allows symmetry. Additionally, it should be noted that the frame of the present invention is not limited to framing cache controllers and data processors, but may frame any plurality of processing elements. Furthermore, many other configurations of the present invention exist.

While there have been described herein the principles of the invention, it is to be clearly understood to those skilled in the art that this description is made by way of example only and not as a limitation to the scope of the invention. Accordingly, it is intended, by the appended claims, to cover all modifications of the invention which fall within the true spirit and scope of the invention.

What is claimed is:

1. An apparatus for attaching a first heatsink to a printed circuit board, wherein the printed circuit board comprises a plurality of data processing elements mounted thereon, the apparatus comprising:
   a plurality of apertures, wherein each of the plurality of apertures corresponds to one of the plurality of data processing elements of the printed circuit board; and
   first attachment means for attaching the first heatsink over at least a first one of the plurality of apertures,
   wherein the plurality of data processing elements comprise an uncapped device and a capped device, and the capped device extends above the printed circuit board higher than the uncapped device, wherein a top of the uncapped device remains between the printed circuit board and a bottom surface of the apparatus, and
   wherein the capped device protrudes through a first one of the plurality of apertures.

2. An apparatus for attaching a first heatsink to a printed circuit board, wherein the printed circuit board comprises a plurality of data processing elements mounted thereon, the apparatus comprising:
   a plurality of apertures, wherein each of the plurality of apertures corresponds to one of the plurality of data processing elements of the printed circuit board;
   first attachment means for attaching the first heatsink over at least a first one of the plurality of apertures; and
   a plurality of standoffs coupled to a bottom surface of the apparatus for coupling the apparatus to the printed circuit board,
   wherein the plurality of data processing elements comprise an uncapped device and a capped device, and the capped device extends above the printed circuit board higher than the uncapped device, wherein a top of the uncapped device remains between the printed circuit board and a bottom surface of the apparatus.

3. An apparatus for attaching the first heatsink to a printed circuit board, wherein the printed circuit board comprises a plurality of data processing elements mounted thereon, the apparatus comprising:
   a plurality of apertures, wherein each of the plurality of apertures corresponds to one of the plurality of data processing elements of the printed circuit board; and
   first attachment means for attaching the first heat sink over at least a first one of the plurality of apertures,
   wherein the plurality of data processing elements comprise an uncapped device and a capped device, and the cap device extends above the printed circuit board higher than the uncapped device, wherein a top of the uncapped device remains between the printed circuit board and a bottom surface of the apparatus, and
   wherein the first attachment means, further comprises:
      a first torsion bar having a first end and a second end;
      a first anchor slot coupled to a top surface of the apparatus, the first anchor slot receiving the first end of the first torsion bar; and
      a first latch coupled to the top surface of the apparatus, the first latch latching the second end of the torsion bar.

4. The apparatus of claim 3, further comprising:
   second attachment means for attaching a second heatsink over at least a second one of the plurality of apertures.

5. The apparatus of claim 4, wherein the second attachment means further comprises:
   a second torsion bar having a first end and a second end;
   a second anchor slot perpendicularly coupled to a top surface of the frame, the second anchor slot receiving the first end of the second torsion bar; and
   a second latch perpendicularly coupled to the top surface of the frame, the second latch latching the second end of the second torsion bar.

6. A printed circuit board, comprising:
   a first data processing element, wherein the first data processing element is a capped element;
   a second data processing element, wherein the second data processing element is an uncapped element;
   a frame coupled to the printed circuit board, the frame comprising:
      a first aperture positioned over the first data processing element; and
      a second aperture positioned over the second data processing element, wherein the first data processing element protrudes through the first aperture of the frame and a top of the second data processing element remains below a bottom surface of the second aperture of the frame.

7. The printed circuit board of claim 6, further comprising:
   a first heatsink positioned over the first aperture of the frame; and
   a second heatsink positioned over the second aperture of the frame.

8. The printed circuit board of claim 6, further comprising:
   a heatsink having a pedestal positioned over the second aperture of the frame, wherein the pedestal extends past the bottom surface of the second aperture of the frame towards the top of the second data processing element.

9. The printed circuit board of claim 6, wherein the frame further comprises:
   a first anchor slot coupled to a top surface of the frame, the first anchor slot being capable of receiving a first end of a first torsion bar;
   a first latch coupled to the top surface of the frame, the first latch being capable of latching the second end of the first torsion bar;
   a second anchor slot coupled to a top surface of the frame, the second anchor slot being capable of receiving the first end of a second torsion bar; and
   a second latch coupled to the top surface of the frame, the second latch being capable of latching the second end of the second torsion bar.

\* \* \* \* \*